US010997520B2

(12) United States Patent
von Salis et al.

(10) Patent No.: US 10,997,520 B2
(45) Date of Patent: May 4, 2021

(54) SINGLE-CYCLE OPERATIONS USING CONTROLLABLY MEDIATED EXCHANGE-TYPE INTERACTIONS BETWEEN QUBITS

(71) Applicant: International Business Machines Corporation, Armonk, NY (US)

(72) Inventors: Gian R. von Salis, Aeugst am Albis (CH); Nikolaj Moll, Thalwil (CH); Stefan Filipp, Zurich (CH); Daniel Josef Egger, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/568,318

(22) Filed: Sep. 12, 2019

(65) Prior Publication Data
US 2020/0285987 A1  Sep. 10, 2020

Related U.S. Application Data

(60) Provisional application No. 62/813,778, filed on Mar. 5, 2019.

(51) Int. Cl.
*B82Y 10/00* (2011.01)
*G06N 10/00* (2019.01)
(Continued)

(52) U.S. Cl.
CPC .............. *G06N 10/00* (2019.01); *B82Y 10/00* (2013.01); *H01L 27/18* (2013.01); *H03K 19/1952* (2013.01)

(58) Field of Classification Search
CPC ........ G06N 10/00; B82Y 10/00; H01L 27/18; H01L 39/223; H03K 19/1952; H03K 19/195; G06F 13/4068
(Continued)

(56) References Cited

U.S. PATENT DOCUMENTS 9,663,358 B1 *  5/2017  Cory .......................... G06F 7/38
2012/0093521 A1 *  4/2012  Harrison ............... H04L 9/0855
398/173
(Continued)

FOREIGN PATENT DOCUMENTS

EP       2171653 B1     4/2010

OTHER PUBLICATIONS

Bhattacharjee et al., "Depth-Optimal Quantum Circuit Placement for Arbitrary Topologies", arXiv:1703.08540v1 [cs.ET], Mar. 24, 2017, 17 pages.
Christandl et al., "Perfect state transfer in quantum spin networks", arXiv:quant-ph/0309131v2, May 5, 2004, 4 pages.
Egger et al., "Entanglement generation in superconducting qubits using holonomic operations", arXiv:1804.04900v1 [quant-ph], Apr. 13, 2018, 8 pages.
(Continued)

*Primary Examiner* — Ly D Pham
(74) *Attorney, Agent, or Firm* — William H. Hartwell; Isaac J. Gooshaw

(57) ABSTRACT

A method of operating a quantum information processing apparatus is provided. This apparatus includes a structure of coupled qubits, where $N \geq 3$, wherein the structure further includes coupling elements. The coupling elements couple pairs of N qubits, wherein, at least, a portion of the qubits are connected by a respective one of the coupling elements, whereby the two qubits of each said pair are connected by a respective coupling element. A method comprises identifying a path of M qubits in the structure of coupled qubits, wherein the path extends from a first qubit to a last qubit of the N qubits. The identified path consists of M qubits and M−1 coupling elements alternating along said path, where $2 < M \leq N$. A single-cycle operation is performed, wherein all pairs of two successive qubits in the identified path are concomitantly subjected to exchange-type interactions of distinct strengths.

23 Claims, 7 Drawing Sheets

(51) Int. Cl.
  *H01L 27/18* (2006.01)
  *H03K 19/195* (2006.01)
(58) Field of Classification Search
  USPC .......................................................... 706/45
  See application file for complete search history.

(56) References Cited

U.S. PATENT DOCUMENTS

| | | | |
|---|---|---|---|
| 2013/0057333 A1* | 3/2013 | Wu | H01L 29/66984 327/530 |
| 2015/0032993 A1* | 1/2015 | Amin | G06N 10/00 712/42 |
| 2015/0046681 A1* | 2/2015 | King | G06N 10/00 712/42 |
| 2017/0220510 A1 | 8/2017 | Hilton | |
| 2018/0121601 A1* | 5/2018 | Hahm | G16B 50/00 |
| 2018/0260731 A1* | 9/2018 | Zeng | G06N 10/00 |
| 2018/0308007 A1* | 10/2018 | Amin | G06N 10/00 |
| 2018/0365021 A1* | 12/2018 | Chen | H04L 9/0631 |
| 2019/0049495 A1* | 2/2019 | Ofek | G06F 17/14 |
| 2019/0220771 A1* | 7/2019 | Boothby | G06F 15/80 |
| 2020/0028673 A1* | 1/2020 | Howe | H04L 9/30 |

OTHER PUBLICATIONS

Gushu et al., "Tackling the Qubit Mapping Problem for NISQ-Era Quantum Devices", arXiv:1809.02573v1 [cs.ET], Sep. 7, 2018, 13 pages.

Loss et al., "Quantum Computation with Quantum Dots", Physical Review a vol. 57, No. 1 Jan. 1998, © 1998 The American Physical Society, 7 pages.

McKay et al., "A universal gate for fixed-frequency qubits via a tunable bus", arXiv:1604.03076v3 [quant-ph], Dec. 19, 2016, 10 pages.

Roth et al., "Analysis of parametrically driven exchange-type (iSWAP) and two-photon (bSWAP) interactions betwee superconducting qubits", arXiv:1708.02090v1 [quant-ph], Aug. 7, 2017, 10 pages.

Salis et al., "Multi-Qubit Entangling Gate Using a Frequency-Modulated Tunable Coupler", U.S. Appl. No. 15/975,011, filed May 9, 2018, 37 pages.

Salis et al., "Single-Cycle Operations in Quantum Processing Apparatuses Via Controllably Mediated Exchange-Type Interactions Between Nearest-Neighbor Qubits", U.S. Appl. No. 62/813,778, filed Mar. 5, 2019, 23 pages.

* cited by examiner

SINGLE-CYCLE OPERATIONS USING CONTROLLABLY MEDIATED EXCHANGE-TYPE INTERACTIONS BETWEEN QUBITS

DOMESTIC PRIORITY

This application claims priority and benefit to U.S. Provisional Application No. 62/813,778, entitled "SINGLE-CYCLE OPERATIONS IN QUANTUM PROCESSING APPARATUSES VIA CONTROLLABLY MEDIATED EXCHANGE-TYPE INTERACTIONS BETWEEN NEAREST-NEIGHBOR QUBITS", filed Mar. 5, 2019, the content of which is incorporated herein by reference in its entirety.

BACKGROUND

The invention relates in general to the field of quantum information processing apparatuses and methods of operation thereof. In particular, it is directed to methods to perform single-cycle operations, wherein pairs of qubits (e.g., superconducting qubits) are subjected to exchange-type interactions.

Recent advances in quantum computing are making such a technology ever more relevant to industrial applications. Quantum computing makes direct use of quantum-mechanical phenomena, such as superposition and entanglement to perform operations on entangled qubits, i.e., states stored in qubits. Superconducting circuits are relatively easy to manufacture with current technologies and are thus promising candidates to further scale quantum information technologies. Small quantum computers based on a couple of hundreds of superconducting qubits with limited to no error correction are able to simulate quantum systems intractable to conventional computers.

SUMMARY

Embodiments of the present invention provide a method, and apparatus of quantum information processing for single-cycle operations, wherein pairs of qubits are subjected to exchange-type interactions.

A first embodiment encompasses a method for quantum information processing for single-cycle operation, wherein pairs of qubits are subjected to exchange-type interactions. One or more processors identify, in said structure, a path extending from a first qubit to a last qubit of the N qubits, said path formed by an alternating sequence of M qubits and M−1 coupling elements, wherein each of the coupling elements connects to two successive qubits in the path, 2<M≤. The one or more processors perform a single-cycle operation, wherein all pairs of two successive qubits in the identified path are concomitantly subjected to exchange-type interactions of distinct strengths, wherein said exchange-type interactions are controllably mediated via the coupling elements in the identified path.

A second embodiment encompasses a method for transmon-type quantum information processing for frequency-tunable couplers. One or more processors identify, in said structure, a path extending from a first qubit to a last qubit of the N qubits, said path formed by an alternating sequence of M qubits and M−1 coupling elements, wherein each of the coupling elements connects to two successive qubits in the path 2<M≤N. The one or more processors, perform a single-cycle operation, wherein all pairs of two successive qubits in the identified path are concomitantly subjected to exchange-type interactions of distinct strengths, wherein said exchange-type interactions of distinct strengths, wherein said exchange-type interactions are controllably mediated via the coupling elements in the identified path by parametrically driving frequencies of each of the M−1 tunable couplers in the identified path with drive amplitudes selected so as to achieve said distinct strengths.

A third embodiment encompasses a quantum information processing apparatus. The apparatus includes a structure of coupled qubits, the structure including N computational qubits, N≥3, and coupling elements coupling pairs of the N qubits, wherein said coupling elements are not configured as computational as computational qubits in the apparatus. The apparatus includes control electronics operatively connected to said structure of coupled qubits and configured to identify, in said structure, a path extending from a first qubit to a last qubit of the N qubits, said path formed by an alternating sequence of M qubits and M−1 coupling elements, wherein each of the coupling elements connected to two successive qubits in the path, 2<M≤N. The apparatus includes control electronics operatively connected to said structure of coupled qubits and configured to perform a single-cycle operation, wherein all pairs of two successive qubits in the identified path are concomitantly subjected to exchange-type interactions of distinct strengths, wherein said exchange-type interactions are controllably mediated via the coupling elements in the identified path.

BRIEF DESCRIPTION OF SEVERAL VIEWS OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which:

FIG. 2B illustrates an indirect swap sequence. On the contrary, FIG. 2C shows a pulse sequence for directly swapping Q00 and Q11 in a single-cycle operation, as in embodiments;

Figure 1A:
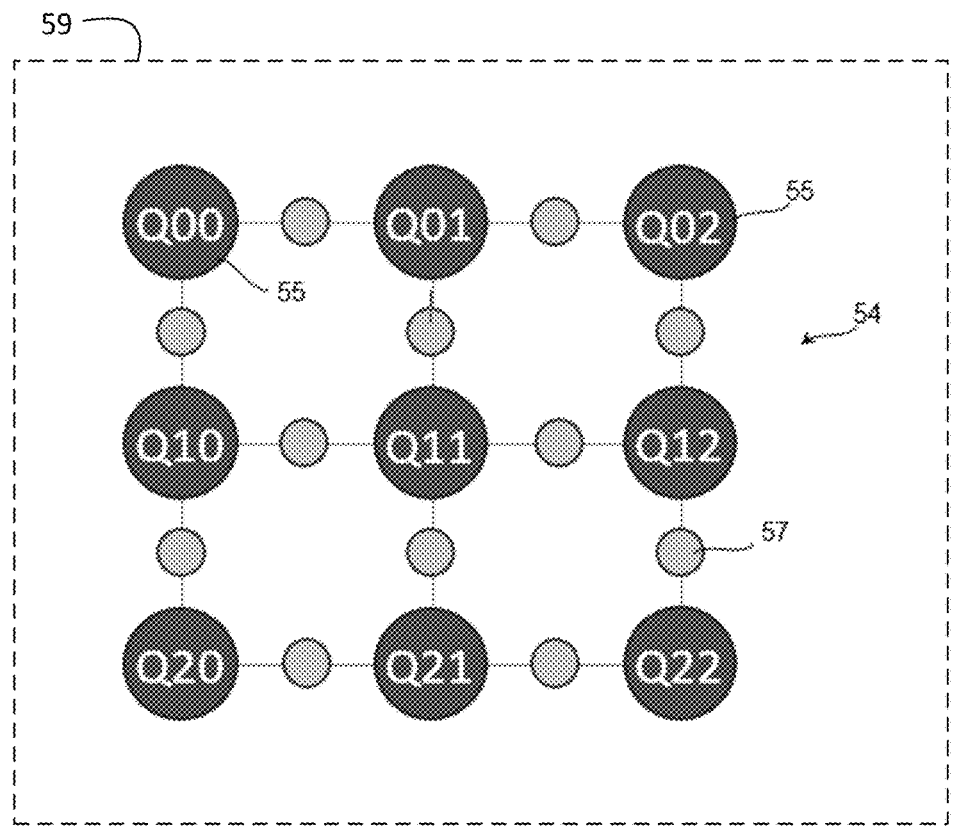
FIGS. 1A, 1B, 2A, and 3 show examples of lattice arrangements of qubits (large disks) and couplers (small disks) forming structures of coupled qubits, as involved in embodiments. Such arrangements can be regarded as logical arrangements of qubits and couplers. Still, such logical arrangements may actually map onto physical layouts of the qubits and couplers (e.g., on actual quantum chips)

Apparatuses and methods embodying the present invention will now be described, by way of non-limiting examples, and in reference to the drawings. Some of these drawings show simplified representations of devices or parts thereof, as involved in embodiments. Similar or functionally similar elements in the figures have been allocated the same numeral references, unless otherwise indicated.

DETAILED DESCRIPTION

For a quantum computer to run arbitrary quantum algorithms, a necessary condition is the existence of a universal gate set that contains single qubit rotations and a suitable two-qubit gate. While in current hardware implementations, single qubit rotations can usually be performed on any qubit in a parallel fashion, two-qubit gates can, in practice, only be operated on nearest-neighbor qubits. However, quantum algorithms will likely require two-qubit gates to be executed between arbitrary pairs of qubits, this including remote qubits. Such a feature would typically require a compilation of the algorithm to the available connectivity map of the quantum hardware. In practice, this means that a large overhead in gate operations (typically performing many swaps, sequentially, between neighboring qubits) is required to first bring two target qubits into neighborhood before performing a two-qubit gate operation on them. This becomes even more challenging if swap operations are not directly available and must be synthesized from other two-qubit gate operations. For example, if the quantum computer can only create two-qubit CNOT gates, then the required swap gates must be synthesized using three CNOT gates each. Therefore, bringing two qubits into neighborhood is a costly operation that greatly increases the circuit depth.

In one embodiment, the present invention is directed to a method of operating a quantum information processing apparatus. This apparatus is assumed to include a structure of coupled qubits, i.e., comprising a set of N computational qubits, where N≥3. The structure further includes coupling elements, which are not configured as computational qubits in the apparatus. Such elements couple pairs of the N qubits. That is, at least some of the pairs of the qubits are connected by a respective one of the coupling elements, whereby the two qubits of each of said pair are connected by a respective coupling element. The method first comprises identifying a path of M qubits in the structure of coupled qubits. The path extends from a first qubit to a last qubit of the N qubits. The path is formed by an alternating sequence of qubits and coupling elements. I.e., in terms of qubits and coupling elements, the identified path consists of M qubits and M−1 coupling elements alternating along said path, where 2<M≤N. Note, although this path primarily corresponds to an abstract path in the structure made out by said qubits and couplers, it also corresponds to an actual physical path. Plus, the abstract path and the physical path may perfectly map onto each other where, e.g., the qubits and couplers are arranged on a same chip. Next, a single-cycle operation is performed, wherein all pairs of two successive qubits in the identified path are concomitantly subjected to exchange-type interactions of distinct strengths. Such interactions are controllably mediated via the coupling elements in the identified path. The invention is further directed to related methods and quantum information processing apparatuses.

With this in mind, the present Inventors have developed novel methods and apparatuses allowing concomitant operations of several qubits in a selected path to be achieved within a single-cycle operation. Such methods and apparatuses are now described in detail.

Possible applications on quantum machines include the solving of difficult optimization problems that are beyond the reach of classical algorithms. For example, quantum optimizations based on the variational principle are particularly appealing. In this approach, an objective function is minimized by varying a trial state that depends on a few parameters. Applications to quantum chemistry, metrology tasks or efficient error-syndrome measurements in error correction codes can notably be contemplated. Such examples of applications require the creation of initial states, as needed in many quantum algorithms. E.g., the initial states need be entangled over many qubits, which, so far, is typically achieved by applying a sequence of single and two-qubit gate operations to a ground state.

However, despite improvements in engineering quantum systems, superconducting qubits can reliably store quantum information only for a finite time, which is known as the coherence time. When the duration of the state preparation and (algorithmic) manipulation is comparable to or larger than the coherence time, the system can no longer be operated. Thus, the total time needed to run the algorithm should be shorter than the coherence time for such qubit systems. Now, the current gate operations consume a substantial amount of the coherence time of the qubits. The number of qubits that can be used in practice is limited because the durations of the state preparation and the algorithmic manipulation increase with the number of qubits. There are several reasons for this, including the limited number of two-qubit gate operations that can be performed in parallel, and the need to entangle distant qubits for which no direct two-qubit gate is available in hardware. This conflicts with the finite coherence time available. It is therefore desirable to create states (be they initial states or subsequent states) and manipulate such states in shorter times, using a hardware-efficient, multi-qubit entangling gate.

In the field of superconducting qubits, the multi-qubit, single-step state preparation problem was so far not an issue. Indeed, the size of the systems was until recently limited to a few qubits, for which two-qubit entangling gates are affordable. For example, two-qubit gates are known, which are implemented with transmon qubits, where the qubits are coupled via a frequency tunable coupler element. In contrast to other approaches, in this implementation the qubits have fixed frequencies, which typically results in high coherence and the possibility to generate entangled two-qubit states with high fidelity.

According to a first aspect, the present invention is embodied as a method of operating a quantum information processing apparatus. This apparatus is assumed to include a structure of coupled qubits, i.e., comprising a set of N computational qubits (e.g., fixed-frequency qubits), where N≥3. The structure further includes coupling elements, which are not configured as computational qubits in the apparatus. Such elements couple pairs of the N qubits. That is, at least some of the pairs of the qubits are connected by a respective one of the coupling elements, whereby the two qubits of each of said pair are connected by a respective coupling element.

The method first comprises identifying a path of M qubits in the structure of coupled qubits. The path extends from a first qubit to a last qubit of the N qubits. The path is formed by an alternating sequence of qubits and coupling elements. I.e., in terms of qubits and coupling elements, the identified path consists of M qubits and M−1 coupling elements alternating along said path, where 2<M≤N. Note, the first qubit and the last qubit are not coupled via a single coupler (i.e., they are not directly coupled to each other). In other words, at least two couplers are involved in the path going from the first qubit to the last qubit in the path.

Next, a single-cycle operation is performed, wherein all pairs of two successive qubits in the identified path are concomitantly subjected to exchange-type interactions of distinct strengths. Remarkably, such interactions are controllably mediated via the coupling elements in the identified path. In practice, many single-cycle operations are performed, and one or more of such operations may require a path of qubits to be identified first, in order to concomitantly subject all pairs of two successive qubits in an identified path to exchange-type interactions as described above.

The present approach makes it possible to couple remote qubits in a single-cycle operation, although such qubits are not physically connected, directly, by any coupling element. For example, remote qubits may undergo a swap operation within a single-cycle operation, even though they are not directly connected by any coupling element. In variants, multi-qubit entangling gates are achieved within single-cycle operations. Control electronics can be used to switch on nearest-neighbor exchange interactions to an adjustable strength, via the coupling elements. Although such coupling elements are not configured as computational qubits, they may nevertheless be practically be embodied as quantum circuits. In practice, such coupling elements may for example be tunable couplers or microwave resonators, as discussed below. As such it is to be understood that such coupling elements are non-computational, i.e., they are devices that are configured to couple two or more qubits together but do not themselves perform the quantum computations, per se, of the qubits.

Thanks to the proposed approach, the time required to perform gate operations increases only slowly with (e.g., the square-root of) the distance between the qubits, therefore providing a significant advantage over known methods to run quantum algorithms on currently available hardware.

In the present context (where $2<M\leq N$), each of M and N need be at least equal to or larger than 3. The case $M=N=3$ corresponds to a special case where the number M of selected qubits corresponds to the total number N of qubits. Still, the present methods and apparatuses preferably involve arrangements of $N\geq 4$ qubits, e.g., arrangements of N=4, 6, 9, or 16 qubits, where at least M=3 qubits are involved in the path. In practice, such qubits will typically be identified by selecting a strict subset of M qubits among the N qubits, i.e., $2<M<N$, where this subset preferably corresponds to a shortest path between end qubits. In other words, if $N\geq 4$, then the selected path can be formed by a strict subset of M computational qubits and the coupling elements in-between.

Preferably, each of said qubits is a superconducting quantum circuit of the transmon-type. The present approach, however, is not restricted to superconducting qubits, e.g., also spin-qubits can be contemplated. In that case, the pairwise exchange-type interactions can be tuned by way of gate potentials.

Said quantum information processing apparatus may typically comprise a chip, whereon said qubits are arranged, e.g., according to a square or hexagonal lattice. The coupling elements are then preferably arranged on the chip and between the two qubits that it connects to. That is, each of the coupling elements that connects to two successive qubits in the path is located, on the chip, between said two successive qubits. Note, the qubits of each of said pairs of two successive qubits preferably correspond to nearest-neighbor qubits on the chip. This eases the design of the layout of the components (qubits, coupling elements, and electromagnetic signal connections in-between) and further helps in achieving more compact arrangements of qubits and coupling elements on the chip.

In a first class of embodiments, said single-cycle operation is performed so as to perform a swap operation between outer qubits (i.e., the first qubit and the last qubit) of the identified path.

In a second class of embodiments, said single-cycle operation is performed so as to entangle L qubits on said path, where $2<L\leq M$ The entangled qubits may possibly include the first qubit and the last qubit on the identified path. This way, one can achieve a multi-qubit entangling gate, whereby a quantum state (e.g., an initial state) is distributed on L qubits on the identified path.

In preferred embodiments, each of said coupling elements is a frequency-tunable coupler. In that case, the exchange-type interactions are preferably mediated by parametrically driving frequencies of the tunable couplers in the identified path with drive amplitudes selected so as to achieve said distinct strengths for said interactions.

In preferred embodiments, each of said qubits is a superconducting qubit of the transmon-type, while each of said coupling elements is a transmon-type, superconducting quantum circuit with a tunable frequency (though not actually serving as a computational qubit).

In other embodiments, said coupling elements are microwave resonators. The latter can be used to apply concomitant drives with selected frequencies to the qubits of each of said pairs of two successive qubits to mediate a geometric interaction between the qubits of each of said pairs.

According to another aspect, the invention is embodied as a method of operating a quantum information processing apparatus, which combines variants as discussed above. Namely, the apparatus now includes a structure comprising: N computational qubits ($N\geq 3$), wherein the computational qubits are superconducting quantum circuits of the transmon-type; as well as coupling elements coupling pairs of the N qubits, wherein said coupling elements are, each, frequency-tunable couplers that are not configured as computational qubits in the apparatus. Consistently with the previous aspect, this method first comprises identifying, in said structure, a path extending from a first qubit to a last qubit of the N qubits, wherein said path is formed by an alternating sequence of M qubits and M−1 coupling elements. As before, each of the coupling elements connects to two successive qubits in the path, where $2<M\leq N$, whereas the first qubit and the last qubit in this path are not connected to each other via a single one of said coupling elements. Next, a single-cycle operation is performed, wherein all pairs of two successive qubits in the identified path are concomitantly subjected to exchange-type interactions of distinct strengths. Said exchange-type interactions are controllably mediated via the coupling elements in the identified path and, this, by parametrically driving frequencies of each of the M−1 tunable couplers in the identified path with drive amplitudes selected so as to achieve said distinct strengths.

According to a further aspect, the invention is embodied as a quantum information processing apparatus, i.e., a quantum computer. Consistently with the above method, this apparatus comprises N computational qubits ($N\geq 3$), as well as coupling elements. Again, such coupling elements are not configured as computational qubits in the apparatus. The apparatus further comprises control electronics operatively connected to said structure of coupled qubits, configured to identify a path of alternating qubits and coupling elements, and perform a single-cycle operation as described above. Namely, the identified path extends from a first qubit to a last qubit in an identified path, wherein said path is formed by an alternating sequence of M qubits and M−1 coupling elements, and wherein each of the coupling elements connects to two successive qubits in the path, with $2<M\leq N$. As said earlier, the first qubit and the last qubit are not connected directly to each other via a single one of said coupling elements. During this single-cycle operation, all pairs of two successive qubits in the identified path are concomitantly subjected to exchange-type interactions of distinct strengths, which are controllably mediated via the coupling elements in the identified path.

As discussed earlier, in likely embodiments, $N\geq 4$, in which case said control electronics may be configured to identify said path by selecting M qubits among the N qubits, where $2<M<N$.

In preferred embodiments, said control electronics is further configured to perform said single-cycle operation so as to perform a swap operation between a first qubit and a last qubit in the identified path.

In variants, or in addition to such embodiments, the control electronics may be configured to perform said single-cycle operation so as to entangle L qubits on said path, where $2<L\leq M$.

The qubits may for example be superconducting quantum circuits of the transmon-type, whereas the coupling elements preferably are, each, frequency-tunable couplers, e.g., transmon-type, superconducting quantum circuits with a tunable frequency. Such a hardware design may advantageously be exploited by having said control electronics configured to perform said single-cycle operation. The latter are performed so as for said exchange-type interactions to be mediated by parametrically driving frequencies of each of the M−1 tunable couplers in the identified path with drive amplitudes selected so as to achieve said distinct strengths for said interactions.

In variants to frequency-tunable couplers, the coupling elements may be embodied as microwave resonators, as discussed earlier in reference to the first aspect of the invention. In such cases, the control electronics may further be configured to perform a single-cycle operation by applying, via the microwave resonators, concomitant drives with selected frequencies to the qubits of each of said pairs of two successive qubits to mediate a geometric interaction between the qubits of each of said pairs.

In practice, the apparatus may advantageously comprise a chip supporting said structure of coupled qubits. In particular, each of the coupling elements that connects to two successive qubits in the path may notably be located, on the chip, between said two successive qubits. In addition, the qubits of each of said pairs of two successive qubits may advantageously correspond to nearest-neighbor qubits on the chip.

As usual, the quantum information processing apparatus may involve series of successive cooling stages, forming a cryostat in which each stage is adapted to be cooled down at a lower temperature than any previous stage in the series. In the present case, the apparatus may comprise a first stage comprising said control electronics, a second (i.e., final) stage including said structure (e.g., embodied as a chip) of coupled qubits, and channels leading to the qubits and the coupling elements. In addition, one or more intermediate stages may be arranged between the first stage and the second stage, thereby forming a series of successive cooler stages, in operation.

Apparatuses and methods embodying the present invention will now be described, by way of non-limiting examples, and in reference to accompanying drawings.

In particular, an architecture has been proposed, wherein two qubits are connected to a single tunable coupler (TC). This architecture allows transitions between two states of the two qubits to be parametrically driven, e.g., by modulating the TC energy at a frequency that corresponds to the difference of the energy between the two states.

In one embodiment, a quantum information processing apparatus includes a structure of coupled qubits, the structure comprises N computational qubits, $N\geq 3$, and coupling elements coupling pairs of the N qubits. The structure identifies a path extending from a first qubit to a last qubit of the N qubits, where the path is formed by an alternating sequence of M qubits and M−1 coupling elements, wherein each coupling elements connects to two successive qubits in the path, $2<M\leq N$, respectively. Additionally, the first qubit and the last qubit, within the path, lack a coupling element that connects the first qubit to the last qubit. The structure performs a single-cycle operation, wherein all pairs of two successive qubits in the identified path are concomitantly subjected to exchange-type interactions of distinct strengths, wherein said exchange-type interactions are controllably mediated via the coupling elements in the identified path.

In one embodiment, the structure performs a single-cycle operation to swap operations between the first qubit and the last qubit in the identified path.

In one embodiment, the structure performs a single-cycle operation to entangle L qubits on said path, where qubits in said path, $2<L\leq M$, respectively.

In one embodiment, said coupling elements of the structure are, each, frequency-tunable couplers, respectively. The exchange-type interactions, of the two successive qubits, are mediated by parametrically driving frequencies of each of the M−1 frequency-tunable couplers in the identified path with drive amplitudes selected so as to achieve said distinct strengths for said interactions while performing said single-cycle operation in the structure.

In one embodiment, said qubits of the structure are, each, superconducting quantum circuits of the transmon-type, respectively, and each of said coupling elements of the structure are a transmon-type, superconducting quantum circuit with a tunable frequency, respectively.

In one embodiment, said coupling elements of the structure are microwave resonators, where said coupling elements are used to apply concomitant drives with selected frequencies to the qubits of each of said pairs of two successive qubits to mediate a geometric interaction between the qubits of each said pair while performing said single-cycle operation, of the structure.

In one embodiment, the qubits of the structure are $N\geq 4$, and said path is identified by selecting M qubits among the N qubits, where $2<M<N$.

In one embodiment, the quantum information processing apparatus further comprises a chip supporting said structure of coupled qubits, whereby each of the coupling elements that connects to two successive qubits in the path are located, on the chip, between said two successive qubits.

In one embodiment, the qubits of each said pairs of two successive qubits correspond to a nearest-neighbor qubits on the chip, of the structure.

According to a first aspect, the present invention is embodied as a method of operating a quantum information processing apparatus 1. This method and its variants are collectively referred to as the "present methods" in the following description.

Figure 2A:
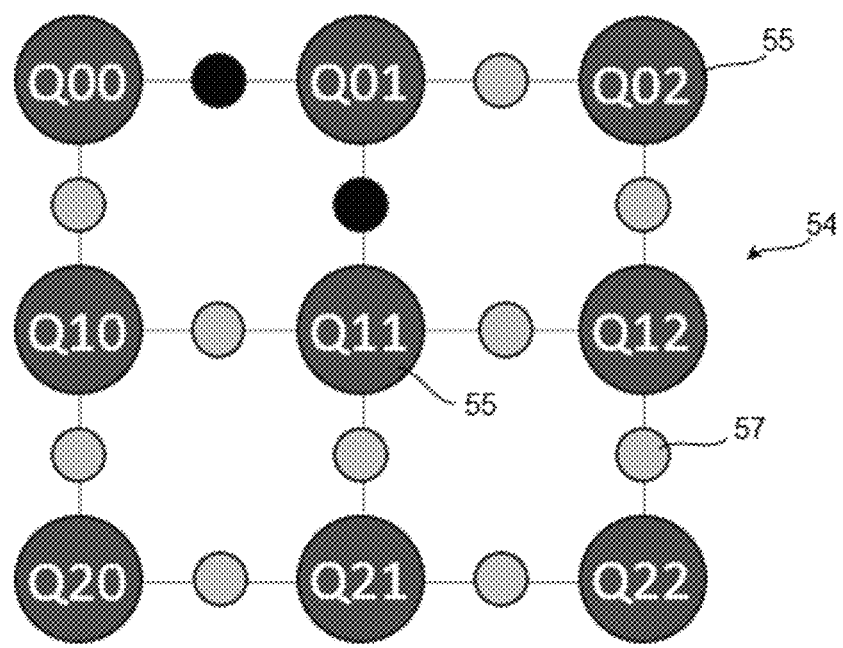
Figure 3:
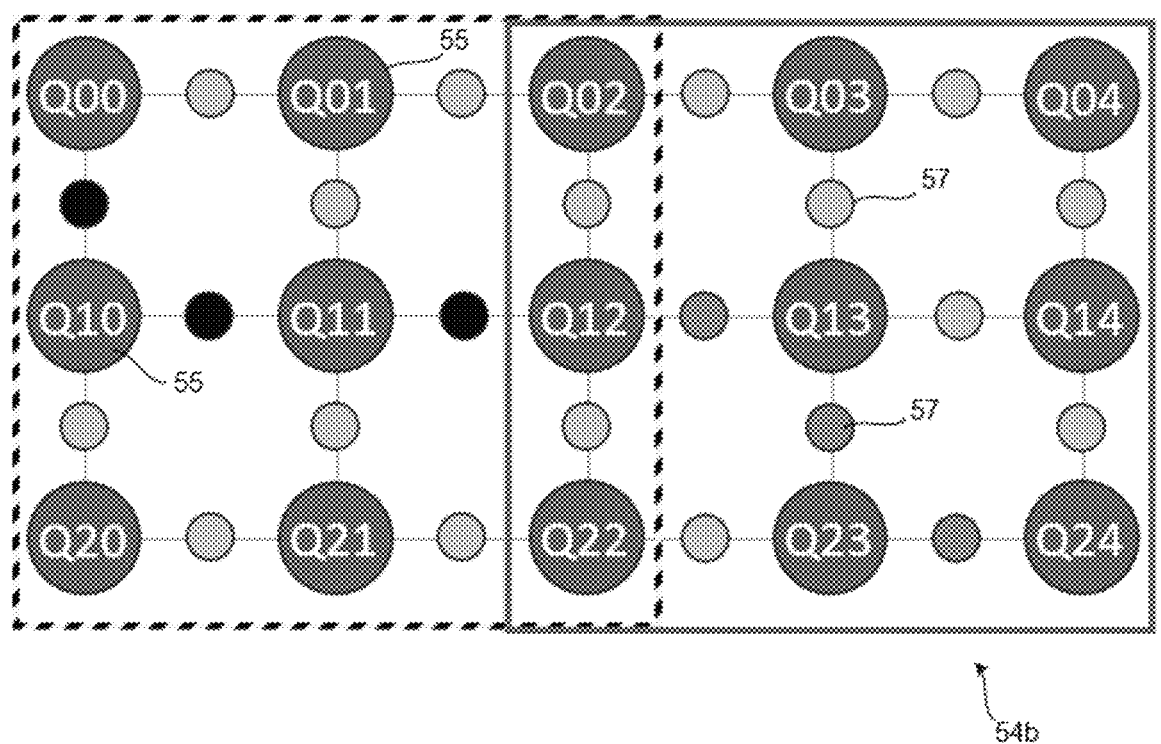
Figure 4:
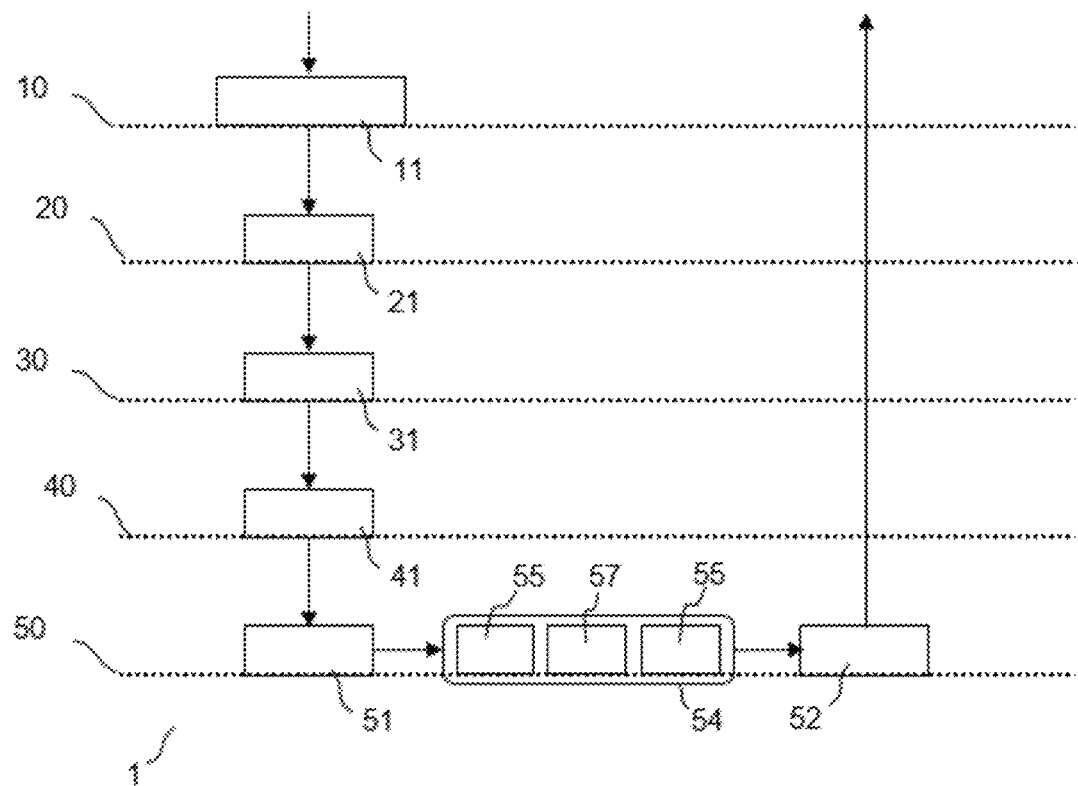
FIG. 4 is a block diagram schematically illustrating selected components of a quantum computer hardware apparatus as used in embodiments.

This apparatus 1 itself is the subject of another aspect of the invention, which is described later in detail. A high-level depiction of components of such an apparatus 1 is shown in FIG. 4. This apparatus is assumed to include a structure 54 of coupled qubits. Examples of such structures 54, 54*a*, 54*b* are shown in FIGS. 1A, 1B, 2A, and 3. Essentially, this structure 54 comprises a set of N computational qubits 55 (e.g., fixed-frequency transmons), where N≥3. The structure 54 further includes coupling elements 57, which couple pairs of qubits. That is, at least some of the pairs of the qubits 55 are connected by a respective coupling element 57, such that the two qubits 55 of each pair of qubits (which normally correspond first-neighbor qubits on a physical layout) are connected by a respective coupling element 57.

Importantly, such coupling elements 57 are not configured as computational qubits in the apparatus 1. The function of such elements 57 is to couple pairs of the N qubits 55, so as to allow a two-qubit interaction between the qubits they (directly) couple, for example by performing an exchange-type interaction between such qubits, to swap the state of the two qubits involved. This exchange-type interaction can for instance be driven parametrically, though different approaches can be contemplated.

For example, two-qubit gates are known in the art, which are implemented with fixed-frequency, transmon qubits, where the qubits are coupled via a frequency-tunable coupler. In practice, the coupling elements 57 may for example be embodied as frequency-tunable couplers or microwave resonators, as discussed below in detail. Note, in that respect, that the coupling elements 57 can advantageously be embodied as superconducting quantum circuits, even though they are not meant to be used as a computational qubit in the present context.

Figure 6:
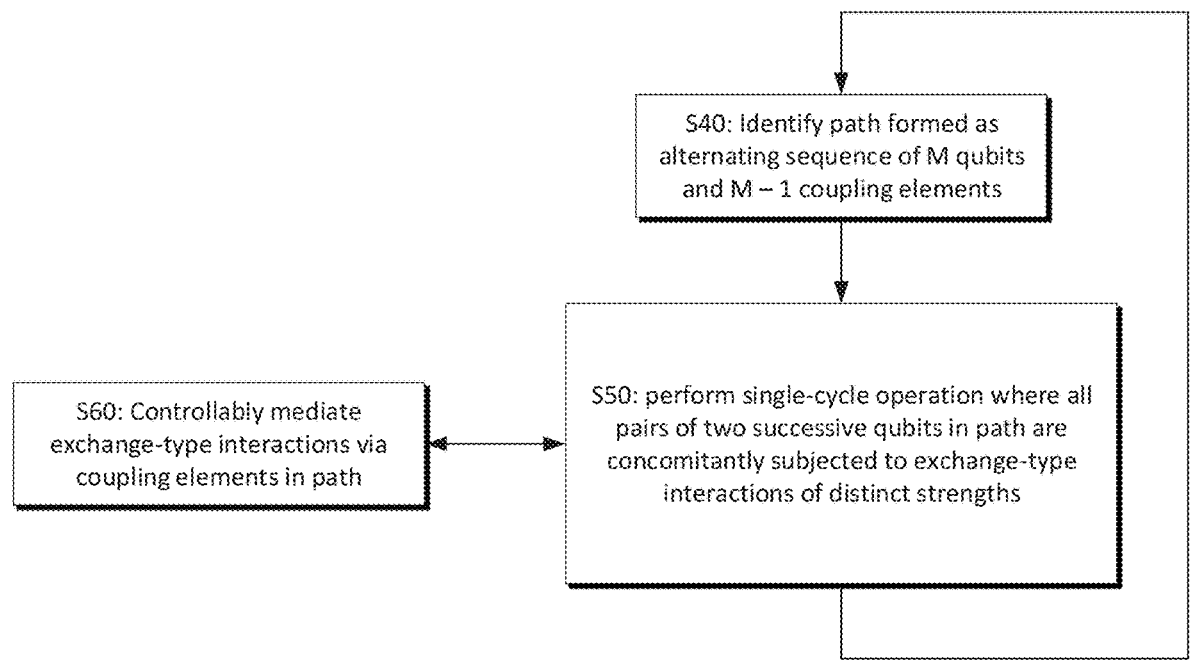
FIG. 6 is a high-level flowchart illustrating method steps as involved in embodiments.

The present methods comprise identifying a path of M qubits in the structure 54 of coupled qubits 55, see step S40 in the flowchart of FIG. 6. The identified path extends between end qubits of the path, i.e., from a first qubit to a last qubit of the N qubits 55. The path is formed by an alternating sequence of qubits 55 and coupling elements 57. Examples of such paths are shown in FIGS. 2A and 3. Such paths are respectively formed, in FIG. 2A, by qubits Q00, Q01, and Q11 (plus the couplers in-between, shown as blackened disks) and, in FIG. 3, by qubits Q00, Q10, Q11, and Q12 (plus the couplers in-between, shown as blackened disks). More generally, in terms of qubits and coupling elements, an identified path consists of M qubits and M−1 coupling elements alternating along said path, where 2<M≤N. Thus, the first qubit and the last qubit are not coupled via a single coupler. i.e., at least two couplers are involved in the path going from the first qubit to the last qubit in the path, such that the first and the last qubits are not directly coupled to each other. In embodiments, the M qubits making up the path correspond to a strict subset of the N qubits in which the selection is performed, i.e., M<N.

As noted earlier, although an identified path primarily corresponds to a logical path (i.e., an abstract path in the structure 54, which corresponds to an ordered, alternating sequence of qubits 55 and coupling elements 57), such a path also corresponds to an actual physical path connecting such coupling elements 55, 57. Plus, the logical path may actually map onto the physical path where, e.g., the qubits 55 and coupling elements 57 are arranged on a same chip. That is, if the qubits 55 and couplers 57 are components arranged on the surface of a chip, where the coupling elements 57 couple first-neighbor qubits 55, then the logical arrangements of qubits 55 and coupling elements 57 as shown in FIGS. 1A, 1B, 2A, and 3 may actually correspond to the physical layout of the same components, as they are seen on the chip (such as chip 59). In that case, FIGS. 1A, 1B, 2A, and 3 may thus be regarded as top views of corresponding quantum chips.

Next, the present methods further comprise performing a single-cycle operation, such as swap operations, see step S50 in FIG. 6. During this operation, all pairs of two successive qubits in the identified path are concomitantly subjected to exchange-type interactions of distinct strengths. For this to work, such interactions need be controllably mediated (see step S60) via the coupling elements that are present in the identified path.

In other words, if one regards the qubits 55 as vertices of a graph and the coupling elements 57 as edges of this graph, the present methods amount to first select two non-adjacent vertices (i.e., the first and the last qubits, not directly coupled) and a path of edges that connect those two vertices, so as to define a subgraph that contains M−1 edges and M vertices, the latter including the first and the last qubits in the path. Then, all M qubits (vertices) along the identified path are concomitantly subjected to exchange-type interactions (of distinct strengths) with their adjacent qubits in the path by controlling the coupling elements defined by the M−1 edges, within a single-cycle operation.

Note, although a single-cycle operation was described so far, many single-cycle operations will likely be performed in practice. Now, according to the present methods, one or more of such operations may require a path of qubits to be identified first, in order to concomitantly subject all pairs of two successive qubits in the identified path to exchange-type interactions (within each of said one or more single-cycle operation), as described above.

Because the remote qubits (i.e., the first and the last qubit in the identified path) are not physically connected, directly, by any coupling element 57, the underlying hardware 1, structure 54 may be regarded as including qubits that are subject to "nearest-neighbor" couplings only. Notwithstanding, the present approach makes it possible to couple remote qubits along the identified path, whereby the remote qubits can be operated in single-cycle operations. e.g., remote qubits may now undergo direct swap operations, even though they are not directly connected by any coupling element 57. In variants, multi-qubit entangling gates are achieved. Control electronics 11 can be used to switch on nearest-neighbor exchange interactions to an adjustable strength, via the coupling elements 57.

Thanks to the chosen approach, the time required to perform gate operations increases only slowly with the distance (in terms of edges, i.e., coupling elements 57) between the qubits 55, therefore providing a significant advantage over known methods to run quantum algorithms on currently available hardware. That is, the duration of the single-cycle operation may possibly increase as the square-root of the distance between the qubits, for reasons that will become apparent later.

Of particular advantage is to rely on transmon qubits 55 and coupling elements that are frequency-tunable coupling elements 57, as in another aspect of the invention. Thus, any identified path will form an alternating sequence of M qubits and M−1 frequency-tunable coupling elements 57, where 2<M≤N, where the first qubit and the last qubit are not connected by any of the frequency-tunable coupling elements 57. Next, during the single-cycle operation performed at step S50, the exchange-type interactions are controllably mediated via the frequency-tunable coupling elements 57 by parametrically driving frequencies of each of the M−1 tunable couplers. Here, the drive amplitudes must be selected so as to achieve the required strengths, as illustrated below by way of examples, in reference to FIGS. 5A-5C.

According to a further aspect, the invention can also be embodied as an apparatus 1. Essential aspects of this apparatus have already been described above. The apparatus 1 notably comprises control electronics 11, as well as a structure 54 of coupled qubits. As discussed earlier, the structure 54 includes N computational qubits (e.g., fixed-frequency transmons), where N≥3, and coupling elements 57 coupling pairs of the N qubits. Again, such coupling elements 57 are not configured as computational qubits in the apparatus 1. In addition, the apparatus typically comprises channels leading to the qubits and the coupling elements. Depending on the technology chosen, such channels may include superconducting channel portions, or optical channels whose optical signals are, e.g., converted on-chip to an electrical signal.

The control electronics 11 is operatively connected to said structure 54 of coupled qubits. Moreover, the control electronics 11 is generally configured to identify a path extending from a first qubit to a last qubit in said structure 54 and perform a single-cycle operation as described above in reference to previous aspects of the invention.

In practice, said control electronics 11 may for instance comprise a compiler and sequencer. The compiler determines and schedules high-level operations, as necessary to run a quantum algorithm on the apparatus 1. The compiler may accordingly come to determine batches of operations to be performed on the qubits 55. The sequencer then decomposes such operations into single-cycle operations, which beyond usual operations such as single- and two-qubit operations, may comprise remote swap operations, during which all pairs of two successive qubits in the path (as identified for such remote swaps) are concomitantly subjected (see step S50) to exchange-type interactions of distinct strengths. Moreover, such exchange-type interactions are controllably mediated (see step S60) via the coupling elements.

Note, a new path will likely need to be identified for each remote swap or each entanglement of L>2 qubits. In some rare cases, however, a same path may serve to successively perform, e.g., a remote swap, prior to entangling qubits in that same path. That is, several single-cycle operations may be successively performed for a same path as identified once at step S40, without it being necessary to select the same path again, etc. Once all single-cycle operations pertaining to a higher-level operation have been completed, a new high-level operation will be determined by the compiler, and so on. Note, high-level operations may possibly involve parallel gates.

In practice, the control electronics may for instance comprise an apparatus (i.e., a controller) to apply control pulses and a scheduler which determines the timing according to which the various pulses are applied. The scheduler must account for the high-level operations of the algorithm while taking into account the connectivity of the qubits.

A typical sequence is as follows: First, a compiler determines new operations to be performed on the qubits. Then, the sequencer decomposes each set of new operations, these include single- and two-qubit gate operations. This may for instance lead to first perform single-qubit gate operations, and then two-qubit gate operations between pairs of qubits that are directly connected by a coupler. Now, for two-qubit gate operations to be performed between remote (i.e., non-directly connected pairs of qubits), suitable swap operations may be identified that bring those qubit pairs into connection. If such a swap operation is between connected qubits, the latter are directly swapped, and a two-qubit gate operation can now be performed between the now connected qubits. Else, a suitable path formed between the two (remote) qubits to be swapped is identified (see step S40), with the path formed as alternating sequence of M qubits and M−1 coupling elements, prior to perform steps S50 and S60 as in FIG. 6.

The qubits 55 are preferably superconducting qubits of the transmon type. And more preferably, the coupling elements 57 are frequency-tunable coupling elements, typically radio-frequency-controlled components, which contain non-linear elements for their frequencies (energies) to be tunable. This allows transitions between states of the qubits to be parametrically driven, by modulating the energies of the tunable couplers. For example, such couplers may involve Josephson junctions as non-linear elements, which are tuned using an external magnetic field. Several examples of such couplers are known per se.

In typical embodiments, the apparatus 1 comprises several cooling stages 10-50. For example, the apparatus 1 may include a first stage 10, which comprises or is connected to control electronics 11. The first stage 10 may notably include one or more signal generators (not shown), to generate signals needed to drive the coupling elements 55, 57. E.g., the signal generators are configured, each, to generate radio frequency (RF) signals to drive the qubits, in operation. The apparatus 1 may further comprise a second stage 50 adapted to be cooled down at a lower temperature than the first stage. Superconducting qubits 55, as well as tunable coupling elements 57, are arranged in the second stage 50, which will likely comprise other electronic components, such as, but are not limited to, attenuators, circulators, isolators etc. 51, 52. The apparatus 1 may further include one or more intermediate stages 20-40 between the first stage 10 and the second stage 50. Thus, the first stage, the intermediate stages 20-40, and the second stage 50 form a series (i.e., a chain) of successive stages, wherein each intermediate stage is adapted to be cooled down at a lower temperature than any previous stage (on top therefrom in FIG. 4) of the series. Each stage 10-50 may comprise a variety of electronic components 11-51, 52 (e.g., attenuators for thermalizing RF signals from the signal generators), communication means (optical, electrical), cooling means, etc.

Various other embodiments can be contemplated, as generally described in the summary section. The following part of the description focuses on hardware implementations and methods to perform two-qubit swap operations between remote qubits, i.e., qubits that are not nearest-neighbors, using hardware designed so as to ensure nearest-neighbor couplings only. In addition, methods are described, which allow multiple qubits connected along an arbitrary path of the hardware's connectivity map to be entangled.

Figure 1B:
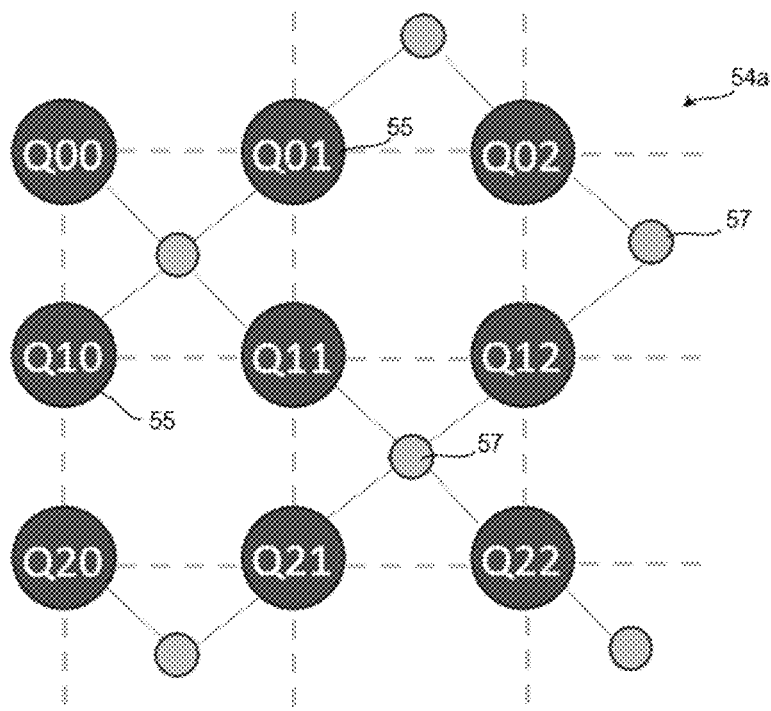

One may for example assume that the connectivity of an array of qubits 55 is such that swap operations between neighboring qubits are possible, as in FIGS. 1A, 1B, 2A, and 3. For example FIG. 1A and FIG. 2A show an example of square-lattice structure 54 of qubits 55 and coupling elements 57, where each qubit 55 is connected to four neighboring qubits through a tunable coupling elements 57. In FIG. 1B, the structure 54a is formed by cells of four qubits 55, each connected to a same, central tunable coupling elements 57, with corner qubits connected to neighboring cells via another tunable coupling elements 57. FIG. 6 depicts another example of square-lattice arrangement of qubits 55, showing two subsets of 3×3 arrays of qubits. In each case, the structure includes N computational qubits 55 (N≥3), as well as coupling elements 57 coupling pairs of the N qubits.

Figure 2B:
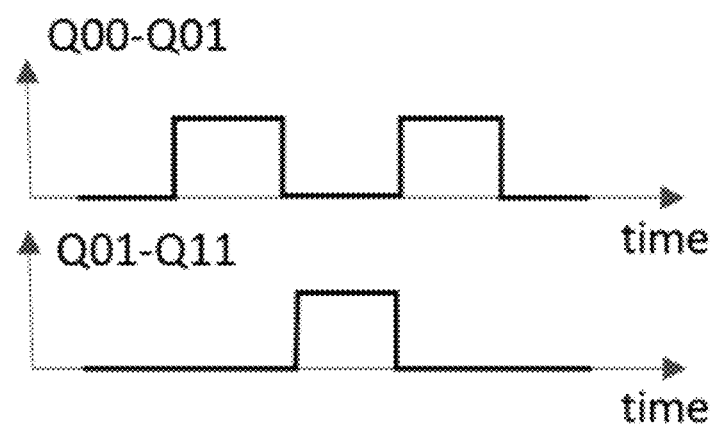
FIGS. 2B and 2C depict pulse sequences for swapping remote qubits Q00 and Q11 of FIG. 2A (no direct two-qubit gate is available in hardware for such qubits), via the highlighted couplers (small, dark disks in FIG. 2A).
Figure 2C:
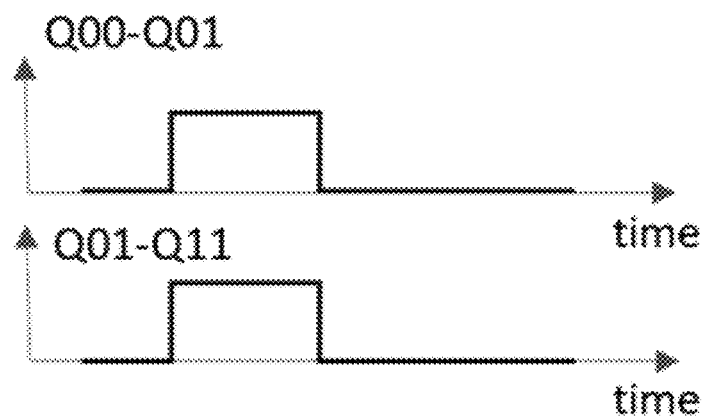

In such architectures, swap operations can be implemented by exchange-type gates or by concatenating other suitable two-qubit gates and single-qubit gates. With usual (prior art) methods, in order to swap remote qubits such as qubits Q00 and Q11 shown in FIG. 1A, a path between Q00 and Q11 need first be selected, for example the path that connects Q00-Q01-Q11. The swap between Q00 and Q11 then involves three successive steps: (i) swap Q00 with Q01, (ii) swap Q01 with Q11, and (iii) swap Q00 with Q01. This requires the gate between Q00 and Q01 to be switched on for a certain time until the first swap is completed, and only then the gate between Q01 and Q11 is switched on, and after this swap is completed, again the first gate is switched on. This is illustrated in FIG. 2B; the swap gates used are shown in FIG. 2A as black dots. In this example, the swap of Q00 with Q11 requires a time that is at least three times the single nearest-neighbor-swap gate time.

If more distant qubits need be swapped, this procedure can be extrapolated: a path is first chosen, and nearest-neighbor swap operations are subsequently carried out, with a total gate time that is a multiple of the single nearest-neighbor-swap gate time, with the multiplier being at least the distance (in terms of edges along the selected path) between the two qubits to be swapped. If the order of the other qubits need be kept intact, the multiplier increases even further, see the rightmost column of Table 1 below:

TABLE 1

Swap times for given drive amplitudes for one, two, three, four and five tone drives. The distance is measured in terms of numbers of couplers involved, e.g., a distance 1 corresponds to swapping two neighboring qubits, involving one coupler to which one tone drive is applied.

| Number $n = M - 1$ of couplers involved in the selected path | Amplitudes | Time needed for single-cycle swap (arbitrary units) | Time needed for sequential nearest-neighbor swaps (arbitrary units) |
| --- | --- | --- | --- |
| 1 | 1.00 | 1 | 1 |
| 2 | 1.41, 1.41 | 1 | 3 |
| 3 | 1.73, 2.0, 1.73 | 1 | 5 |
| 4 | 2.00, 2.45, 2.45, 2.00 | 1 | 7 |
| 5 | 2.24, 2.83, 3.00, 2.83, 2.24 | 1 | 9 |

The present invention recognizes that remote qubits may, in theory, be swapped within a single cycle by selecting a path between remote qubits (e.g. Q00-Q01-Q11 in the above example) and by exposing the qubits to a simultaneously occurring exchange interaction between neighboring qubits along the selected path.

In particular, a perfect swap can be achieved by selecting the strength $a_i$ of individual couplings according to:

$$a_i \propto \sqrt{i(n+1-i)}, \quad (1)$$

where n denotes the number of the couplings between neighboring qubits along the path and $i \in \{1, \ldots, n\}$ is the numbered label of the coupling. In the example considered above and illustrated in FIG. 2A, this number is $n=2$, the coupling between Q00 and Q01 is labelled as $i=1$, and the coupling between Q01 and Q11 is labelled as $i=2$. The strength $a_i$ of each coupling is thus proportional to $\sqrt{2}$ according to equation (1) above.

As a further example, in a chain of 6 qubits with 5 couplers in-between, the individual coupling strengths must be proportional to $\sqrt{5}, \sqrt{8}, \sqrt{9} \sqrt{8}$, and $\sqrt{5}$. Thus, provided that the couplings can be set according to equation (1), a single-cycle swap can be achieved in a constant time that does not depend on the number of qubits along the chain.

However, so far, the above considerations are theoretical only. By contrast, the present document describes methods and hardware implementations that make it possible to effectively achieve such operations in practice, as well as single-cycle multi-qubit entanglement gates of a selectable subset of the qubits. Essentially, such implementations aim at concomitantly subjecting all pairs of two successive qubits in the identified path to exchange-type interactions of distinct strengths. Now, in order to achieve this in practice, the exchange-type interactions are controllably mediated via the coupling elements 57 arranged between the successive pairs of qubits in the selected path.

This approach can be applied to an arbitrary number of qubits with exchange interactions between neighboring qubits, whose strength can be concomitantly (e.g., simultaneously) tuned between zero and a selectable value.

As already discussed earlier, the tunable exchange interaction can for instance be implemented by placing a frequency-tunable coupling elements 57 between neighboring qubits 55. In embodiments, the tunable couplers are realized as transmon-type quantum circuits with tunable frequencies. Such a transmon-type coupling element 57 is itself coupled with a fixed strength to the neighboring qubits 55. The interaction between the neighboring qubits 55 is then mediated by parametrically driving the frequency (i.e., the energy) of each tunable-coupler transmon-type coupling element 57, e.g., at the difference (or sum) frequencies of the neighboring qubits. By selecting the amplitude of this drive, the exchange interaction between the neighboring qubits can be controllably tuned from an off-state (at zero amplitude) to an interaction of selectable strength. The coupling leads to a swap (more specifically, an exchange-type interaction that could also lead to iswap or bswap) operation between the neighboring qubits at an adjustable rate. Note, the operation of a tunable coupler with a parametric interaction between two qubits is known per se, albeit in different contexts. Details of how to implement such a tunable coupler can be found in [McKay], see the references provided in the background section.

In variants to tunable exchange interactions, microwave resonators can be used. Microwave resonators can be placed between neighboring qubits 55, and a concomitant drive with suitable frequencies applied to the neighboring qubits 55 mediates a geometric interaction between the qubits. Such geometric interactions are described in [Egger].

Preferred qubits are fixed-frequency, superconducting qubits 55 of the transmon type. Fixed-frequency qubits usually lead to better qubit properties than qubits of tunable frequency. However, other types of qubits can be considered, provided such qubits can couple to a tunable coupler or a microwave resonator, e.g., charge or spin qubits with sufficiently large electric dipole moment.

The example in FIG. 1A shows a 2D arrangement of qubits Qij where vertical and horizontal neighbors can interact with each other through individual tunable couplers, the latter being shown as small, light-grayed disks. In the above notation, the index i indicates the row and j stands for the column index of the qubit. Other configurations with, e.g., additional diagonal connections, or 1D chains or 3D arrangements of the qubits can be contemplated too.

An alternative implementation is shown in FIG. 1B where plaquettes of four qubits are each connected to one tunable coupler, and corner qubits provide connectivity to neighboring plaquettes by being coupled to two separate tunable couplers of two neighboring plaquettes. In this implementation, Q00 can be directly swapped with Q11 (as well as with Q10 and Q01), by selecting the respective difference energy (frequency) of the qubits involved. If, however, Q00 need be swapped with Q21, concomitant swaps of Q00 with Q11 and Q11 with Q21 are initiated by driving the parametric tunable coupler between qubits Q00 and Q11 at the difference frequencies of Q11 and Q00, and concomitantly the parametric tunable coupler between qubits Q11 and Q21 at the respective difference frequency of these two qubits.

A control electronics 11 switches on the involved nearest-neighbor exchange interactions concomitantly on selected tunable couplers (black disks in FIG. 2A) to an adjustable strength. This, in fact, is possible both with exchange (swap) gates with tunable couplers and with geometric interactions.

Figure 5A:
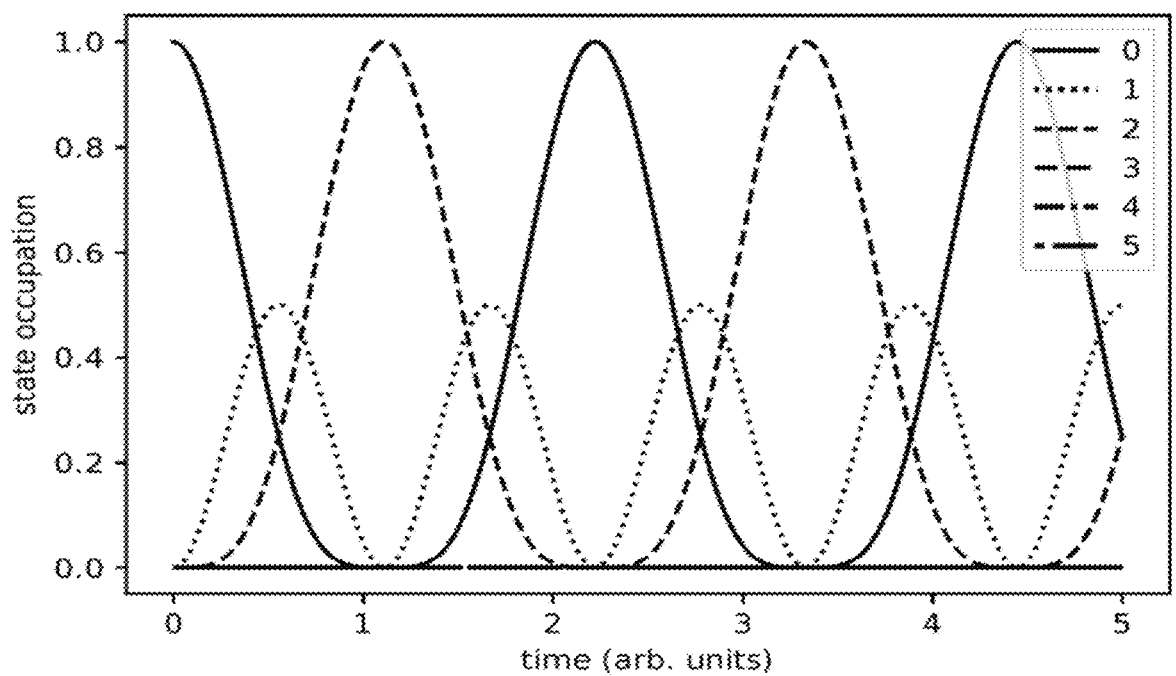
FIGS. 5A-5C show state occupancies as obtained from simulations of swap operations between remote qubits in a linear chain of six qubits, numbered 0 to 5, where the swap operations are performed in a single-cycle operation, according to embodiments.

FIG. 5A aggregates results of a simulation of a swap between qubits 0 and 2 in a linear chain of 6 qubits (labeled 0 to 5) in total, with relative amplitudes of 1.000, 1.000, 0.000, 0.000, and 0.000 for the concomitantly driven nearest-neighbor swap operations. This corresponds to a swap between Q00 and Q11 in FIG. 2A. Two exchange gates (one between qubit 0 and qubit 1, and one between qubit 1 and qubit 2) are driven concomitantly. In the initial state at time 0, only qubit 0 is excited. Over time, the excitation is swapped from qubit 0 via qubit 1 into qubit 2. The swap between qubits 0 and 2 is completed after a time of 1.07 (arbitrary units). After this time, qubits 1, 3, 4 and 5 are back in their original state.

The curves shown in FIG. 5A illustrates the quantum-mechanical evolution of the three qubits Q00, Q01, Q11 evoked above, when starting from the |100> state, where |ijk> indicates the occupation numbers i, j, and k of the three qubits involved. In FIG. 5A, the occupation levels of the states |100>, |010>, and |001> are respectively labeled with 0, 1, and 2. A direct transition of the |100> state to the |001> state can be seen with an intermediate occupation of the |010> state by 50%. Performing such simulations for the full set of initial states shows that a unitary swap operation between Q00 and Q11 can indeed be achieved, resulting in the following matrix representation of the transformation:

$$Swap_{13} = \begin{pmatrix} 1 & 0 & 0 & 0 & 0 & 0 & 0 & 0 \\ 0 & 0 & 0 & 0 & 1 & 0 & 0 & 0 \\ 0 & 0 & 1 & 0 & 0 & 0 & 0 & 0 \\ 0 & 0 & 0 & 0 & 0 & 0 & 1 & 0 \\ 0 & 1 & 0 & 0 & 0 & 0 & 0 & 0 \\ 0 & 0 & 0 & 0 & 0 & 1 & 0 & 0 \\ 0 & 0 & 0 & 1 & 0 & 0 & 0 & 0 \\ 0 & 0 & 0 & 0 & 0 & 0 & 0 & 1 \end{pmatrix}$$

In this notation, the matrix is acting on the following basis:

$$\begin{pmatrix} |000\rangle \\ |001\rangle \\ |010\rangle \\ |011\rangle \\ |100\rangle \\ |101\rangle \\ |110\rangle \\ |111\rangle \end{pmatrix}.$$

Figure 5B:
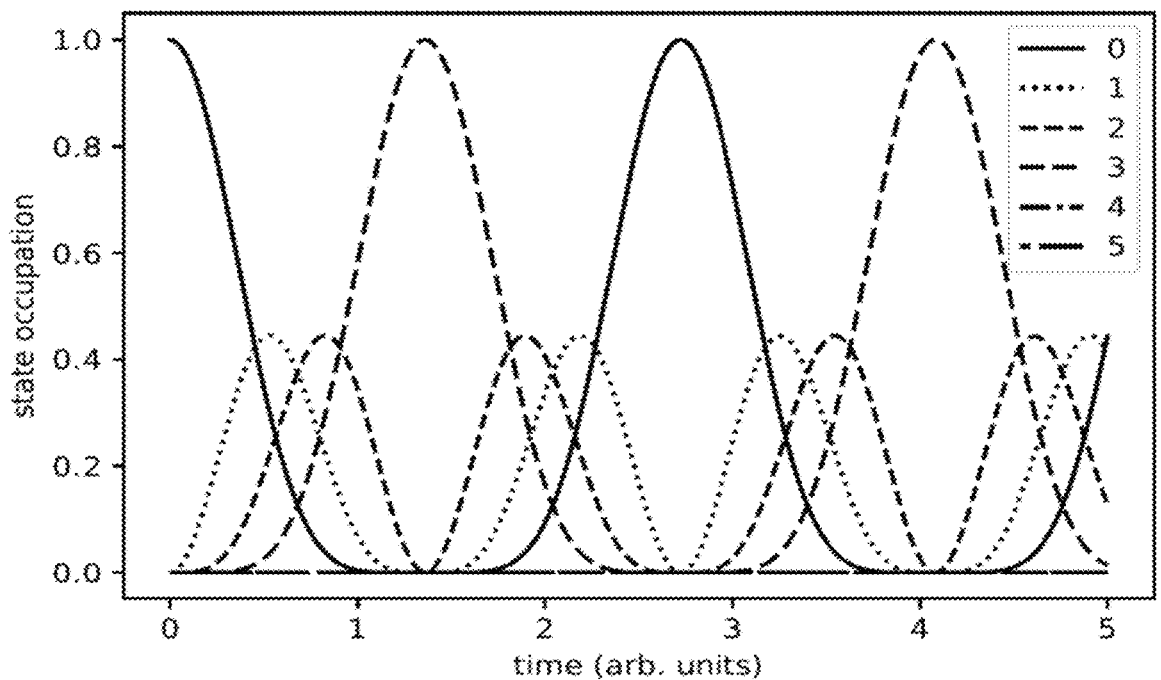

FIG. 5B aggregates results of a simulation of a swap between qubit 0 and qubit 3 in a string of four qubits, with relative amplitudes of 1.000, 1.155, 1.000, 0.000, and 0.000 for the concomitantly driven nearest-neighbor swap operations. I.e., starting with a |1000> state (qubit 0), one swap to the |0001> state (qubit 3) directly by transitioning through qubit 1 and qubit 2. The populations of these two intermediate states is tunable through the exact amplitudes of the nearest-neighbor swap gates. In this example, the suitable amplitudes for the swap between qubit 1 and 2 is 15 percent larger than the amplitudes for the swaps between 0 and 1 and qubits 2 and 3. In other words, qubits 0 and 3 are swapped by concomitantly adjusting the three couplers involved along the path to a same rate. It is seen that starting with a |1000> state, the |0001> state can be directly obtained (i.e., in a single-cycle operation) with a transition through partial occupations of the |0100> and |0010> states. In this way, a unitary swap gate between qubit 0 and qubit 3 is achieved. Note that, at the same time, qubit 1 swaps with qubit 2.

This scheme can be extended to an arbitrary distance between two qubits by selecting a path between the two qubits (preferably the shortest path involving n couplers) and by switching on concomitantly the n couplers at suitable nearest-neighbor swap rates, e.g., as given by Eq. (1).

Figure 5C:
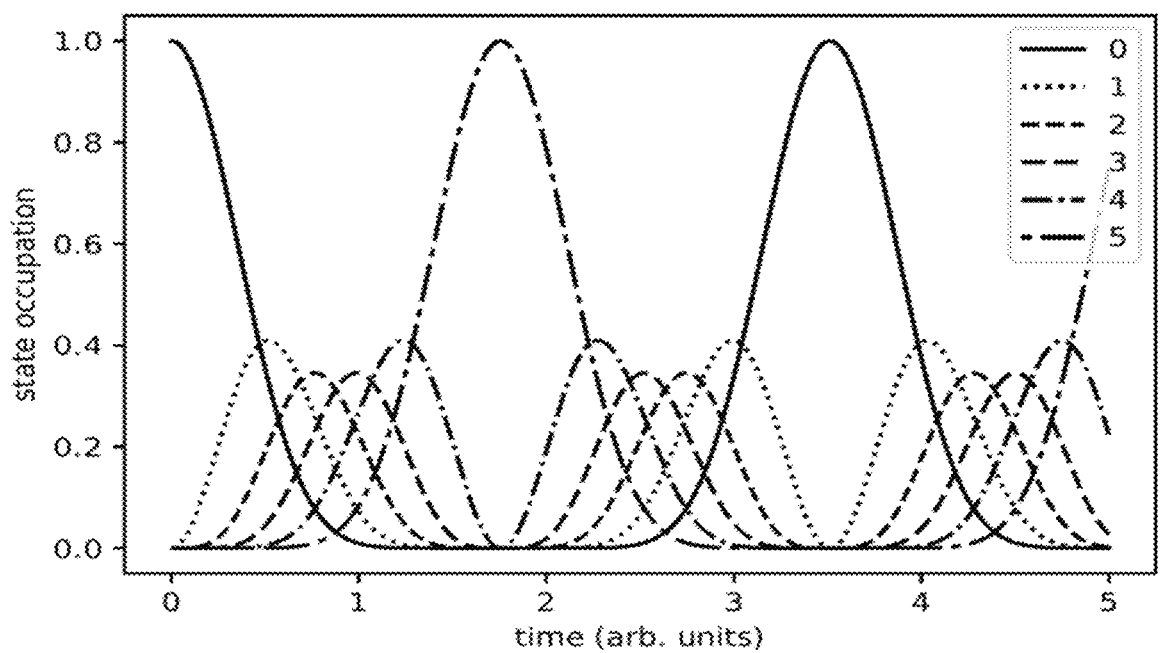

A simulation of such a swap operation is shown in FIG. 5C, which shows results of a simulation of a swap operation between qubit 0 and qubit 5, with relative amplitudes of 1.000, 1.265, 1.342, 1.265, and 1.000 for the concomitantly driven nearest-neighbor swap operations. Note, in this mode of operation, qubit 1 is swapped with qubit 4 and qubit 2 with qubit 3, concomitantly with qubit 0 being swapped with qubit 5. More generally, the proposed concomitant driving of nearest-neighbor swap gates may lead to a swap of all qubits involved along the selected path, with the center of the path being a mirror axis.

Table 1 above lists the relative amplitudes $a_i$ required for different distances of such swap operations in a time that does not depend on n. Values are obtained from Eq. (1). It is seen that the required amplitudes of the couplers at the edges increase with the square-root of n, while the center amplitudes scale with n/2. In cases where such an increase in amplitude cannot be afforded by the hardware, the amplitudes can still be reduced at the cost of a slower swap gate.

Applications to multi-qubit entangling gates are now discussed in detail. As can be understood from FIGS. 5A and 5B, if the gate operation is interrupted at an arbitrary time, an entangling gate can be achieved where, e.g., an initial state |1000> is distributed on the qubits along the path, and where occupations can be selected via the total pulse duration. In the example of a swap with three qubits and n=2 couplers as shown in FIG. 5A, stopping the driving of the couplers half way through the full swap (at a time of 0.54 in FIG. 5A) results in an entangled state where |100>, |010> and |001> are concomitantly populated. Extending this to all possible initial states results in the following transformation matrix (up to complex phases of the indicated matrix elements):

$$(Swap_{13})^{1/2} = \begin{pmatrix} 1 & 0 & 0 & 0 & 0 & 0 & 0 & 0 \\ 0 & \frac{1}{2} & \frac{1}{\sqrt{2}} & 0 & \frac{1}{2} & 0 & 0 & 0 \\ 0 & \frac{1}{\sqrt{2}} & 0 & 0 & \frac{1}{\sqrt{2}} & 0 & 0 & 0 \\ 0 & 0 & 0 & \frac{1}{2} & 0 & \frac{1}{\sqrt{2}} & \frac{1}{2} & 0 \\ 0 & \frac{1}{2} & \frac{1}{\sqrt{2}} & 0 & \frac{1}{2} & 0 & 0 & 0 \\ 0 & 0 & 0 & \frac{1}{\sqrt{2}} & 0 & 0 & \frac{1}{\sqrt{2}} & 0 \\ 0 & 0 & 0 & \frac{1}{2} & 0 & \frac{1}{\sqrt{2}} & \frac{1}{2} & 0 \\ 0 & 0 & 0 & 0 & 0 & 0 & 0 & 1 \end{pmatrix}$$

By selecting a path between neighboring qubits and by concomitantly tuning the coupling strength of the tunable couplers to desired values, multiple qubits can be entangled along that path in a single-cycle gate operation. Other multi-qubit entangling gates can be envisioned by combining such (fractional) single-cycle swap operations with single qubit rotations. Note, the method proposed here for the entanglement generation goes beyond a scheme where multi-qubit entanglement is locally created between qubits coupled to a same tunable coupler. Namely, here a method is proposed that allows for multi-qubit entanglement generation over large distances. Now, variants can be contemplated, which combine both local and remote multi-qubit entanglement at the same time.

In each of the examples of FIGS. 5A to 5C, the number N of computational qubits 55 involved is larger than four, and the selected path said path is identified by selecting M qubits among the N qubits, with 2<M<N.

At present, the control of drive amplitudes and drive frequencies of frequency-tunable coupler drives is discussed in more detail. The concomitant (parametric) driving of multiple tunable couplers between neighboring qubits may possibly lead to Stark shifts or dispersive shifts of the qubit frequencies. This will affect the frequency of the parametric drives applied to the individual couplers. This can easily be calibrated in cases where single tunable couplers are driven at a given time. If parametric drives are concomitantly applied to multiple tunable couplers with common qubits connected, all qubits that are connected to more than one driven tunable couplers (i.e., all qubits inside the selected qubit chain) may then be shifted by two tunable couplers concomitantly. Such multiple Stark shifts can be calibrated away using the following calibration procedure, as verified by way of experiments and additionally in a full numerical simulation of a 4-qubit chain with parametrically-driven tunable couplers:

For each of the n tunable couplers of the selected path: individually calibrate swap-rate versus drive amplitude and optimize frequency of the parametric drive for each drive amplitude, providing a look-up table of swap-rate versus amplitude and frequency versus amplitude.

From a desired single-cycle swap time obtain the desired individual swap rates from Eq. 1 or Table 1 of each tunable coupler involved within a selected path of qubits to be entangled or swapped. By interpolation of the look-up table obtained in step 1, find the required amplitudes and frequencies of the parametric drives for the desired single-cycle swap time.

Initialize the first qubit to a |1> state and all other qubits to |0>. Apply drive amplitudes and frequencies selected in step 1 above concomitantly to the tunable couplers. Optimize the n frequencies of the tunable coupler drives with the goal to maximize the measured population probability of the last qubit after the selected single-cycle swap time. This results in optimized frequencies for the selected path, which frequencies are stored in a look-up table for future swap or entangling operations.

A similar calibration procedure can be obtained if the tunable coupler is replaced by a microwave resonator and the exchange-type interaction is implemented as a geometric gate operation, replacing step 1 above by the procedure as described in [Egger].

The following discusses single-cycle swap operations in subsets of a qubit array. In order to reduce the calibration overhead for large qubit arrays where many possible paths can be selected (which all need be calibrated), the qubit array can be divided into smaller subsets of qubits, in which all possible swap paths within each subset are calibrated and parameters stored in look-up tables. If algorithms require swap operations beyond such subsets, a compiler then divides such swap operations into sequential single-cycle swap operations within these subsets. It is favorable to select such subsets to overlap at the edges such that the sequential swaps that lead across different subsets are connected at qubits at the edges of the subsets, see FIG. 6 for an example of subsets of 3×3 qubits.

Namely, FIG. 3 shows two subsets of 3×3 arrays of qubits, each with calibrated paths of chains of swap. If Q00 needs to be swapped with Q24, first a single-cycle swap from Q00 to Q12 is performed (with the blackened couplers switched on), followed by a single-cycle swap from Q12 to Q24 (with the blackened couplers switched on). In addition to a reduction of the calibration overhead, this scheme limits potentially undesired swaps of the middle qubits in the chain. In the example of the FIG. 3, at the end of the two sequential single-cycle swaps, the state of Q00 is transferred to Q24, the state of Q12 to Q00, and the state of Q24 to Q12. If one single-cycle swap would be performed along the chain Q00-Q10-Q11-Q12-Q13-Q23-Q24, Q00 would be swapped with Q24, Q10 with Q23 and Q11 with Q12.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A method of operating a quantum information processing apparatus including a structure of coupled qubits, the structure comprising N computational qubits, wherein N≥3, and coupling elements coupling pairs of the N qubits, the method comprising;
identifying, in said structure, a path extending from a first qubit to a last qubit of the N qubits, said path formed by an alternating sequence of M qubits and M−1 coupling elements, wherein each of the coupling elements connects to two successive qubits in the path, wherein 2<M≤N, and wherein the first qubit and the last qubit lack a coupling element that connects the first qubit to the last qubit; and
performing, a single-cycle operation, wherein all pairs of two successive qubits in the identified path are concomitantly subjected to exchange-type interactions of distinct strengths, wherein said exchange-type interactions are controllably mediated via the coupling elements in the identified path,
wherein said apparatus further comprises a chip supporting said structure of coupled qubits, whereby each of the coupling elements that connects to two successive qubits in the path is located, on the chip, between said two successive qubits.

2. The method according to claim 1, wherein
said single-cycle operation is performed so as to perform a swap operation between the first qubit and the last qubit in the identified path.

3. The method according to claim 1, wherein
said single-cycle operation is performed so as to entangle L qubits on said path, where 2<L≤M.

4. The method according to claim 1, wherein
said coupling elements are, each, frequency-tunable couplers, whereby the exchange-type interactions are mediated by parametrically driving frequencies of each of the M−1 frequency-tunable couplers in the identified path with drive amplitudes selected so as to achieve said distinct strengths for said interactions while performing said single-cycle operation.

5. The method according to claim 4, wherein
said qubits are, each, superconducting quantum circuits of the transmon-type and each of said coupling elements is a transmon-type, superconducting quantum circuit with a tunable frequency.

6. The method according to claim 1, wherein
said coupling elements are microwave resonators, which are used to apply concomitant drives with selected frequencies to the qubits of each of said pairs of two successive qubits to mediate a geometric interaction between the qubits of each of said pairs while performing said single-cycle operation.

7. The method according to claim 1, wherein
N≥4, and
said path is identified by selecting M qubits among the N qubits, where 2<M<N.

8. The method according to claim 1, wherein
the qubits of each of said pairs of two successive qubits correspond to a nearest-neighbor qubits on the chip.

9. A method of operating a quantum information processing apparatus including a structure of coupled qubits, the structure comprising: N fixed-frequency, computational qubits, wherein N≥3, wherein the computational qubits are superconducting quantum circuits of the transmon-type; and coupling elements coupling pairs of the N computational qubits, wherein said coupling elements are, each, frequency-tunable couplers, the method comprising:
identifying, in said structure, a path extending from a first qubit to a last qubit of the N qubits, said path formed by an alternating sequence of M qubits and M−1 coupling elements, wherein each of the coupling elements connects to two successive qubits in the path, wherein 2<M≤N, and wherein the first qubit and the last qubit lack a coupling element that connects the first qubit to the last qubit; and
performing a single-cycle operation, wherein all pairs of two successive qubits in the identified path are concomitantly subjected to exchange-type interactions of distinct strengths, wherein said exchange-type interactions are controllably mediated via the coupling elements in the identified path by parametrically driving frequencies of each of the M−1 tunable couplers in the identified path with drive amplitudes selected so as to achieve said distinct strengths.

10. A quantum information processing apparatus comprising:
a structure of coupled qubits, the structure including N computational qubits, wherein N≥3, and coupling elements coupling pairs of the N qubits; and
control electronics operatively connected to said structure of coupled qubits and configured to:
identify, in said structure, a path extending from a first qubit to a last qubit of the N qubits, said path formed by an alternating sequence of M qubits and M−1 coupling elements, wherein each of the coupling elements connects to two successive qubits in the path, wherein 2<M≤N, and wherein the first qubit and the last qubit lack a coupling element that connects the first qubit to the last qubit; and
perform a single-cycle operation, wherein all pairs of two successive qubits in the identified path are concomitantly subjected to exchange-type interactions of distinct strengths, wherein said exchange-type interactions are controllably mediated via the coupling elements in the identified path,
wherein said control electronics is further configured to perform said single-cycle operation so as for said exchange-type interactions to be mediated by parametrically driving frequencies of each of the M−1 frequency-tunable couplers in the identified path with drive amplitudes selected so as to achieve said distinct strengths for said interactions.

11. The quantum information processing apparatus according to claim 10, wherein
said control electronics is further configured to perform said single-cycle operation so as to perform a swap operation between a first qubit and a last qubit in the identified path.

12. The quantum information processing apparatus according to claim 10, wherein
said control electronics is further configured to perform said single-cycle operation so as to entangle L qubits on said path, where 2<L≤M.

13. The quantum information processing apparatus according to claim 10, wherein
said qubits are, each, superconducting quantum circuits of the transmon-type.

14. The quantum information processing apparatus according to claim 10, wherein
said coupling elements are, each, frequency-tunable couplers.

15. The quantum information processing apparatus according to claim 10, wherein
said qubits are, each, superconducting quantum circuits of the transmon-type and each of said coupling elements is a transmon-type, superconducting quantum circuit with a tunable frequency.

16. The quantum information processing apparatus according to claim 10, wherein
said coupling elements are microwave resonators.

17. The quantum information processing apparatus according to claim 16, wherein
said control electronics is further configured to perform said single-cycle operation by applying, via the microwave resonators, concomitant drives with selected frequencies to the qubits of each of said pairs of two successive qubits to mediate a geometric interaction between the qubits of each of said pairs.

18. The quantum information processing apparatus according to claim 10, wherein
$N \geq 4$, and
said control electronics is further configured to identify said path by selecting said M qubits among the N qubits, where $2<M<N$.

19. The quantum information processing apparatus according to claim 10, wherein
said apparatus further comprises a chip supporting said structure of coupled qubits.

20. The quantum information processing apparatus according to claim 19, wherein
each of the coupling elements that connects to two successive qubits in the path is located, on the chip, between said two successive qubits.

21. The quantum information processing apparatus according to claim 20, wherein
the qubits of each of said pairs of two successive qubits correspond to nearest-neighbor qubits on the chip.

22. The quantum information processing apparatus according to claim 10, wherein the apparatus further comprises:
a first stage comprising said control electronics;
a second stage including said structure, as well as channels leading to the qubits and the coupling elements; and
one or more intermediate stages between the first stage and the second stage, thereby forming a series of successive stages, each adapted to be cooled down at a lower temperature than any previous stage in the series.

23. The quantum information processing apparatus according to claim 10, wherein
each of said computational qubits are fixed-frequency qubits.

* * * * *